United States Patent
Chen et al.

(10) Patent No.: US 6,744,292 B2
(45) Date of Patent: Jun. 1, 2004

(54) LOOP FILTER CAPACITOR MULTIPLICATION IN A CHARGE PUMP CIRCUIT

(75) Inventors: Shin Chung Chen, Los Gatos, CA (US); Vincent Wing Sing Tso, Milpitas, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 10/280,314

(22) Filed: Oct. 25, 2002

(65) Prior Publication Data

US 2004/0080359 A1 Apr. 29, 2004

(51) Int. Cl.[7] ............................................... H03L 7/06
(52) U.S. Cl. ........................................ 327/156; 327/148
(58) Field of Search ................................... 327/148, 156

(56) References Cited

U.S. PATENT DOCUMENTS

| | | | | |
|---|---|---|---|---|
| 5,477,193 A | * | 12/1995 | Burchfield | 331/8 |
| 5,734,279 A | * | 3/1998 | Bereza | 327/112 |
| 5,767,736 A | * | 6/1998 | Lakshmikumar et al. | 327/536 |
| 5,831,484 A | * | 11/1998 | Lukes et al. | 331/17 |
| 6,243,031 B1 | * | 6/2001 | Jusuf et al. | 341/68 |
| 6,255,872 B1 | * | 7/2001 | Harada et al. | 327/157 |
| 6,292,061 B1 | * | 9/2001 | Qu | 331/17 |
| 6,472,915 B1 | * | 10/2002 | Moyal et al. | 327/157 |
| 6,483,358 B2 | * | 11/2002 | Ingino, Jr. | 327/157 |

* cited by examiner

Primary Examiner—Terry D. Cunningham
(74) Attorney, Agent, or Firm—Towsend and Towsend and Crew LLP

(57) ABSTRACT

A charge pump circuit with a small loop filter capacitor is disclosed in the invention. This is accomplished by providing multiple currents which add to the desired current, I. A switching circuit switches one of the currents through the capacitor, while directing a combination of the multiple currents through the resistors. In this way, a smaller current is provided through the capacitor, allowing the capacitor to be much smaller in size.

8 Claims, 6 Drawing Sheets

2nd Order Lead-Lag Passive Filter

Conventional Differential Charge Pump with a discrete capacitor loop Filter

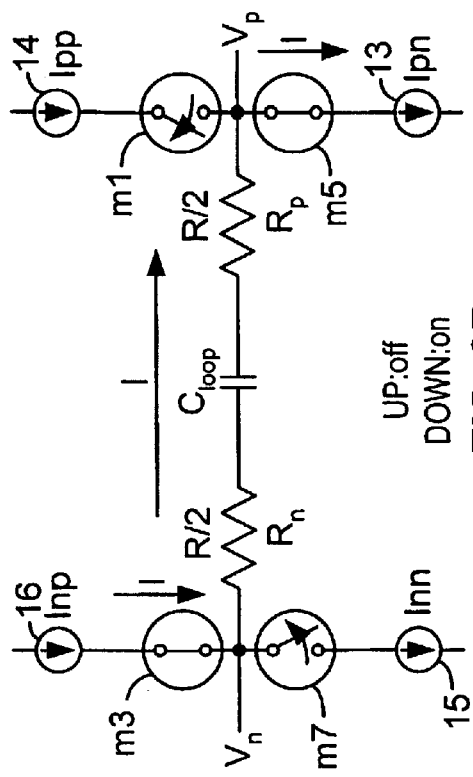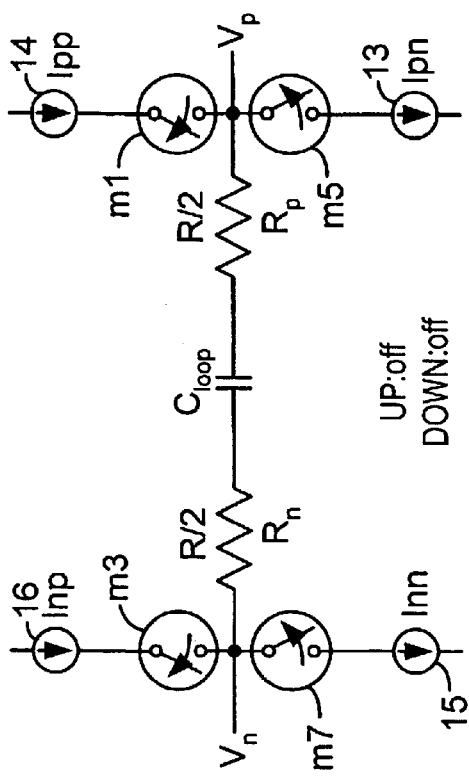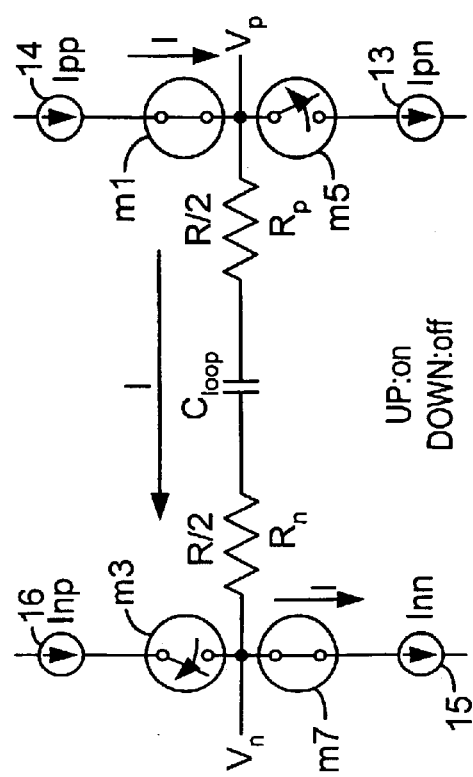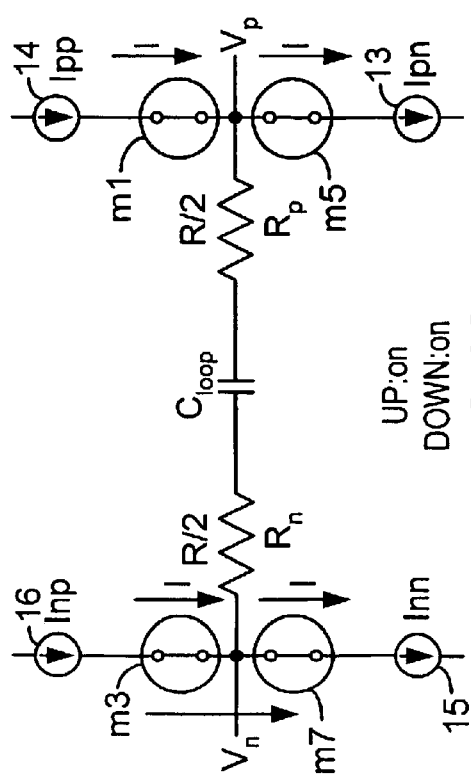
FIG. 3A PRIOR ART
FIG. 3B PRIOR ART
FIG. 3C PRIOR ART
FIG. 3D PRIOR ART

LOOP FILTER CAPACITOR MULTIPLICATION IN A CHARGE PUMP CIRCUIT

BACKGROUND OF THE INVENTION

The present invention relates to charge pump circuits used in a Phase Locked Loop (PLL), and in particular to techniques for reducing the capacitor size of the loop filter capacitor.

A conventional differential charge pump circuit with a loop filter included is shown in FIG. 1. Typically, the input to the charge pump circuit is the phase difference between a received signal and a signal attempting to lock-on to the receive signal. The output of the charge pump would typically be provided to a voltage controlled oscillator (VCO) to adjust the oscillator frequency accordingly to match the phase of the input signal. The low pass loop filter is coupled to the output of the charge pump to provide an analog output control voltage to the VCO.

As shown in FIG. 1A, a pump up signal from the phase detector is provided on an input 10, and a pump down signal on an input 12. These low-active signals switch on switching transistors M1 and M3, respectively. The current to M1 and M3 is provided by current source transistors 14 and 16, which each provides a current I.

When the pump down signal is applied on line 12, current I flows through turned on transistor M3, through resistor $R_N$, capacitor $C_{loop}$ resistor $R_P$, and through transistor M5. The positive version of a pump down signal (pdn) will turn on an MOS transistor M5, providing a sink path for the current. At the same time, the pump up signal will be off, turning off transistor M1 and corresponding transistor M7. Transistors 13 and 15 are current sink transistors.

When the pump down signal is inactive, and the pump up signal is active, and transistors M1 and M7 will be on, providing current I in the opposite direction through the capacitor. Transistors 17, 18, 20 and 22 are provided to give a path to steer the current away from the loop filter when their corresponding switching transistors M3, M1, M5 and M7 are turned off. Amplifier 24 is a Common Mode Feed Back (CMFB) amplifier.

Typically, the capacitor is a discrete capacitor which is off-chip. This is because the capacitor needs to be large enough to satisfy design requirements. For example, for SONET, there is a 0.1 dB peaking limit, which requires a large capacitor. This cannot be achieved by simply using a smaller current and smaller capacitor, since that would adversely impact other design requirements.

FIG. 1B illustrates, in a simplified manner, the loop filter composed of resistors $R_N$, $R_P$ and capacitor $C_{loop}$ in FIG. 1A. The shunt capacitors to ground $C_S$, for the lead-lag filter are also included.

One approach to provide an on-chip capacitor which is smaller, and thus doesn't require a large silicon area, is illustrated in U.S. Pat. No. 6,344,772, inventor Patrik Larsson. This patent shows an operational amplifier based capacitor multiplication circuit. In essence, through the use of an operational amplifier the effective capacitance value can be multiplied. Unfortunately, this introduces problems of its own, such as problems with Power Supply Rejection Ratio (PSRR), offset, bandwidth and noise. However, it does avoid the problems associated with off-chip capacitors, such as leakage and parasitic capacitance.

FIG. 2 illustrates in simplified format the operational amplified-based circuit, using an operational amplifier 30 with resistors $R_1$ and $R_2$, and capacitor C. The right side of FIG. 2 shows the equivalent circuit with the effective resistance, $R_{eff}$ and the effective capacitance, $C_{eff}$. The below analysis demonstrates how this capacitor multiplication effect is achieved.

Since $$V_x = \frac{1}{1+sCR_1}V_o, \tag{a}$$

$$I_1 = \frac{V_o - V_x}{R_1} \text{ and } I_2 = \frac{V_o - V_x}{R_2} \text{ and} \tag{b}$$

$$V_o - V_x = \frac{sCR_1}{1+sCR_1}V_o \tag{c}$$

Now $$\begin{aligned}
Z &= \frac{V_o}{I_1 + I_2} && \text{from Eqs. (a)-(c)}\\
&= \frac{R_1 R_2 V_o}{(R_1+R_2)(V_o - V_x)},\\
&= \frac{R_1 R_2}{R_1 + R_2}\left(1 + \frac{1}{sCR_1}\right)\\
&= \frac{R_1 R_2}{R_1 + R_2} + \frac{1}{sC\left(1+\frac{R_1}{R_2}\right)}\\
&\approx \frac{R_1 R_2}{R_1 + R_2} + \frac{1}{sC\frac{R_1}{R_2}}, \text{ if } \frac{R_1}{R_2} = K \gg 1\\
&= R_1 \parallel R_2 + \frac{1}{sC_{eff}}
\end{aligned}$$

where $$C_{eff} \approx KC$$

BRIEF SUMMARY OF THE INVENTION

The present invention provides a charge pump circuit with a small loop filter capacitor. This is accomplished by providing multiple currents which add to the desired current, I. A switching circuit switches one of the currents through the capacitor, while directing a combination of the multiple currents through the resistors. In this way, a smaller current is provided through the capacitor, allowing the capacitor to be much smaller in size.

In one embodiment, two switching transistors are provided in parallel for each of the pump up and pump down inputs, with the size of the transistor providing the appropriate fractional current. One switching transistor provides the current I through the resistor, but a separate switching transistor diverts a fractional part of it so that it does not flow through the capacitor. A third switching transistor provides current through a second transistor in a differential design, bypassing the capacitor, such that the combined current from the current portion passing through the capacitor and the current portion separately provided to the additional resistor combine to make the total current I.

For a further understanding of the nature and advantages of the invention, reference should be made to the following description in conjunction with the accompanying drawings.

BRIEF DESCRIPTION OF THE DRAWINGS

FIGS. 3A–3D are diagrams illustrating the current flow for different pump up and pump down conditions for a loop filter according to the prior art.

DETAILED DESCRIPTION OF THE INVENTION

Figures 1A, 1B:
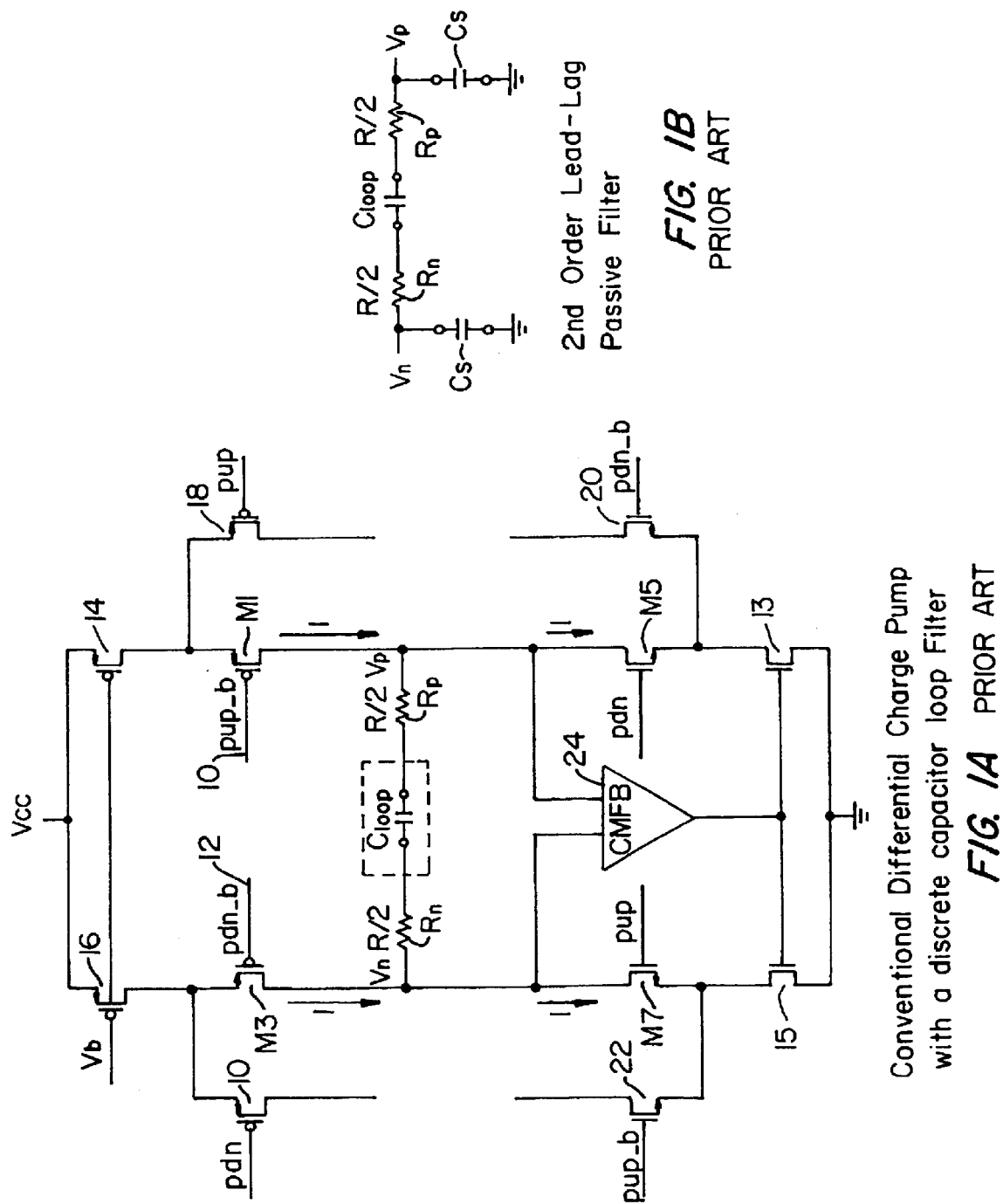
FIG. 1A is a circuit diagram of a conventional differential charge pump with a discrete capacitor loop filter of the prior art.
FIG. 1B is a schematic diagram of the second-order loop filter of FIG. 1A, of the prior art.
Figure 2:
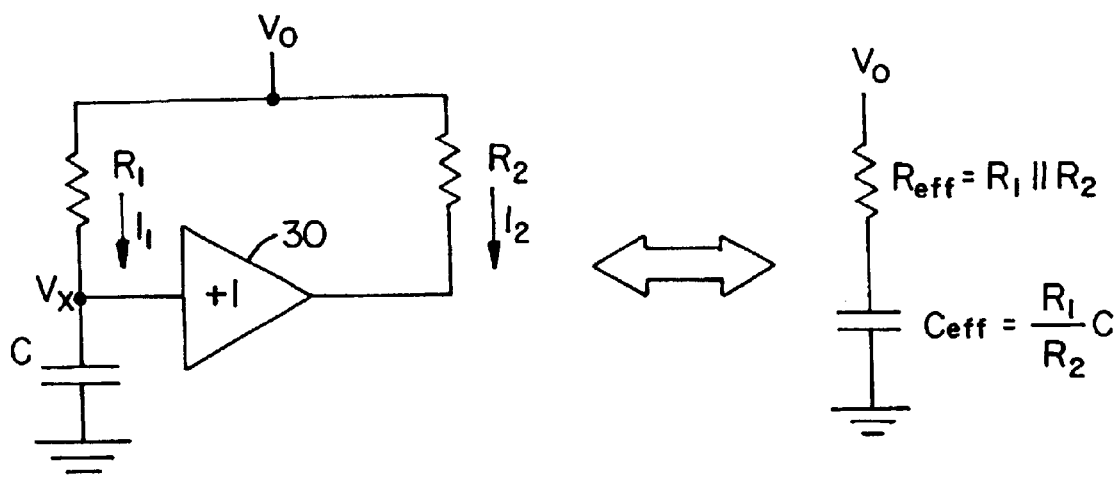
FIG. 2 is a diagram of operational amplifier-based capacitor multiplication circuit of the prior art and an equivalent circuit representation.

To understand the present invention, a description of the current flow in the prior art is appropriate. FIGS. 3A–3D illustrate different switch configurations and current flows for a simplified version of FIG. 1A. Shown are switches corresponding to transistors M1, M3, M5 and M7 of FIG. 1A, as well as current sources corresponding to current sources 14, 16, 13 and 15, also referred to as current sources $I_{PP}$, $I_{NP}$, $I_{PN}$, and $I_{NN}$. As can be seen, switches M1 and M7 are closed, corresponding to their associated current sources being "ON". Switches M3 and M5 are open, effectively turning off their corresponding current sources 16 and 13.

Consider a conventional differential loop filter (for simplicity in discussion, we neglect the shunt capacitors from $V_P$ and $V_N$ to ground) shown in FIG. 3A with pump-up condition applied. All current sources are of magnitude I. Current sources $I_{PP}$, $I_{NN}$ are "ON" and $I_{PN}$, $I_{NP}$ are "OFF". All components in the filter see a current of magnitude I. And therefore, the impedance between $V_P$ and $V_N$ is $$Z = \frac{V_p - V_n}{I} = R + \frac{1}{SC_{loop}} \quad (1)$$

In FIG. 3B, a pump down condition is applied. Current sources $I_{PN}$ and $I_{NP}$ are "ON" and $I_{PP}$ and $I_{NN}$ are "OFF". All components in the filter again see a current of magnitude I. And therefore, the impedance between $V_P$ and $V_N$ is identical to the expression in Eq. (1).

In FIG. 3C, both pump up and pump down conditions are applied at the same time, all current sources are "ON" and current sources $I_{PP}$ and $I_{NP}$ are drained by $I_{PN}$ and $I_{NN}$ respectively. Therefore, no current flows in the filter.

Finally, in FIG. 3D, both pump up and pump down conditions are "OFF". All current sources are "OFF". Again no current flows in the filter. These complete all combinations of pump up/pump down conditions of the conventional differential loop filter.

FIGS. 4A–4D correspond to FIGS. 3A–3D, with the additional circuitry of the present invention. In particular, referring to FIG. 4A, there is the addition of transistor switches M2, M4, M6 and M8 with their corresponding current sources. The current provided through transistors M4 and M6 $I_{npi}$ or $I_{pni}$ is a fractional current of $I_{pp}$ or $I_{nn}$.

Figure 4A:
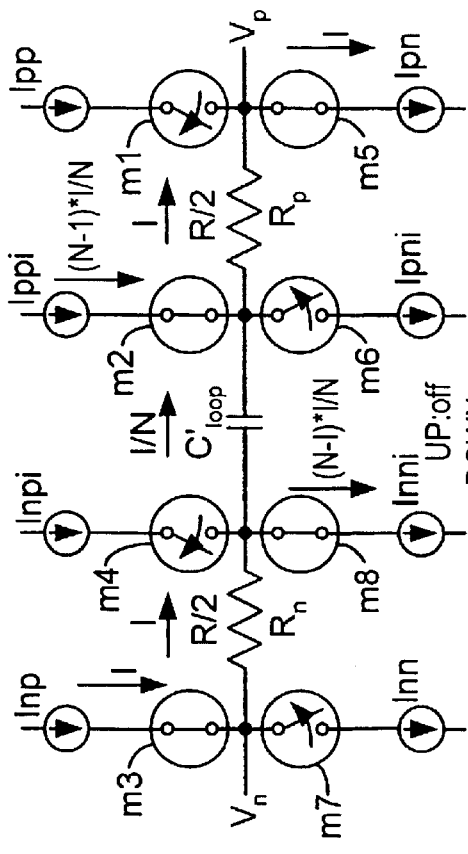
FIGS. 4A–4D are diagrams illustrating the current flow for a differential loop filter according to an embodiment of the present invention.

Consider the filter in accordance with an embodiment of the present invention shown in FIG. 4A with pump-up condition applied. Current sources $I_{PP}$, $I_{NN}$ of current I and $I_{PNI}$, $I_{NPI}$ of current $$\frac{N-1}{N}I$$

are "ON". It can be seen that current I flows through the resistors while current $$\frac{I}{N} = I - \frac{N-1}{N}I,$$

goes through the capacitor $C'_{loop}$. Therefore, the voltage between $V_p$ and $V_n$ is $$V_p - V_n = IR + \frac{I}{N}\frac{1}{SC'_{loop}} = IR + \frac{I}{S(NC'_{loop})}$$

Hence, $$Z = \frac{V_p - V_n}{I} = R + \frac{1}{S(NC'_{loop})} \quad (2)$$

Therefore, the contribution to the total impedance from capacitor $C'_{loop}$ in this case, is seen as though it is coming from an effective capacitance $C_{eff} = NC'_{loop}$ if the prior arts conventional filter configuration in FIG. 3 had been used. If the impedance in Eq. (2) is to be equal to that of Eq. (1), in other words, $C_{eff} = C_{loop}$, then, $$C'_{loop} = \frac{C_{loop}}{N};$$

A N-time smaller capacitor can be used to yield the same result.

Figure 4B:
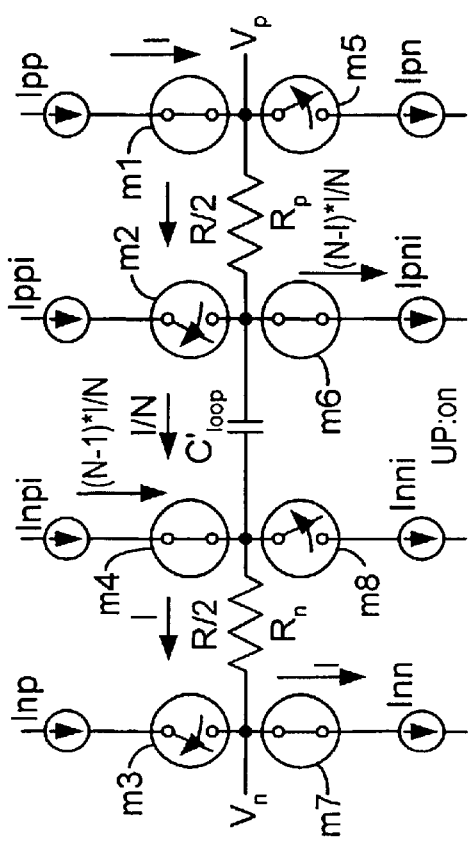
Figure 4C:
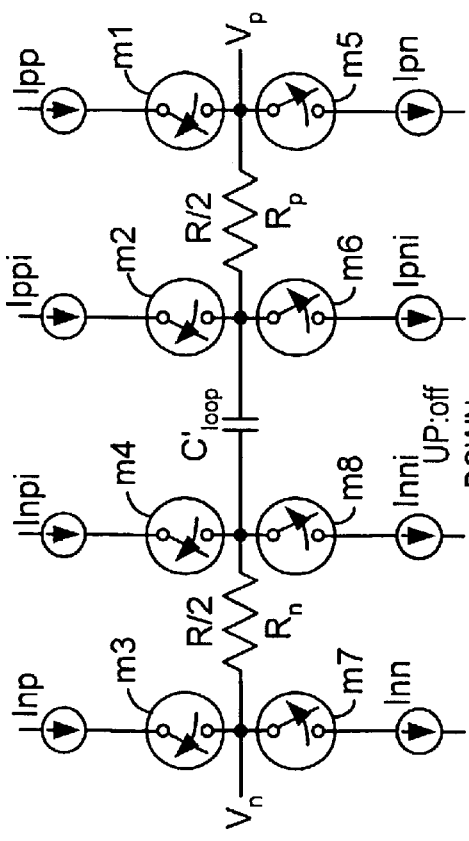
Figure 4D:
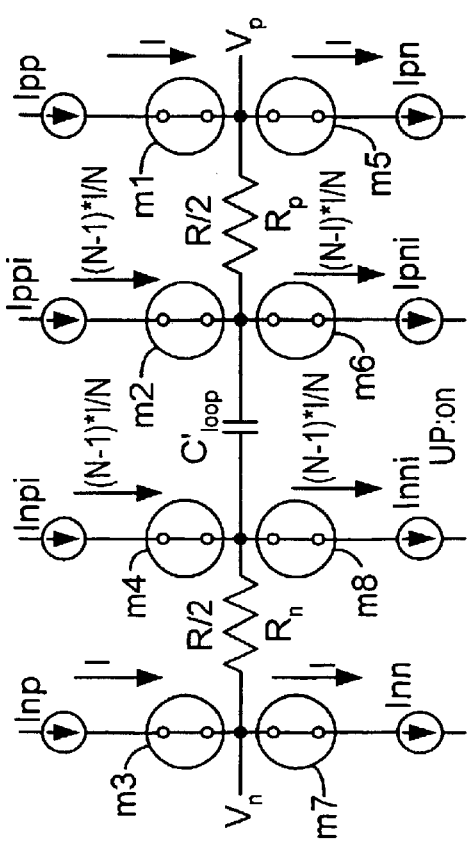

In FIG. 4B, a pump down condition is applied. Current sources $I_{PN}$, $I_{NP}$ of current I and $I_{PPI}$, $I_{NNI}$ of current $$\frac{N-1}{N}I$$

are "ON", $I_{pp}$, $I_{nn}$ of current I and $I_{pni}$, $I_{npi}$ of current $$\frac{N-1}{N}I$$

are "OFF". Again, it can be seen that current I flows through the resistors while current $$\frac{I}{N} = I - \frac{N-1}{N}I,$$

goes through the capacitor C'loop and the impedance between $V_p$ and $V_n$ is identical to that of Eq. (2). FIGS. 4C and 4D are for both pump up, pump down are "ON" and "OFF" conditions respectively. Similar to the conventional cases, no current flows in the filter. These complete all combinations of pump up/pump down conditions for the modified filter topology.

Figure 5:
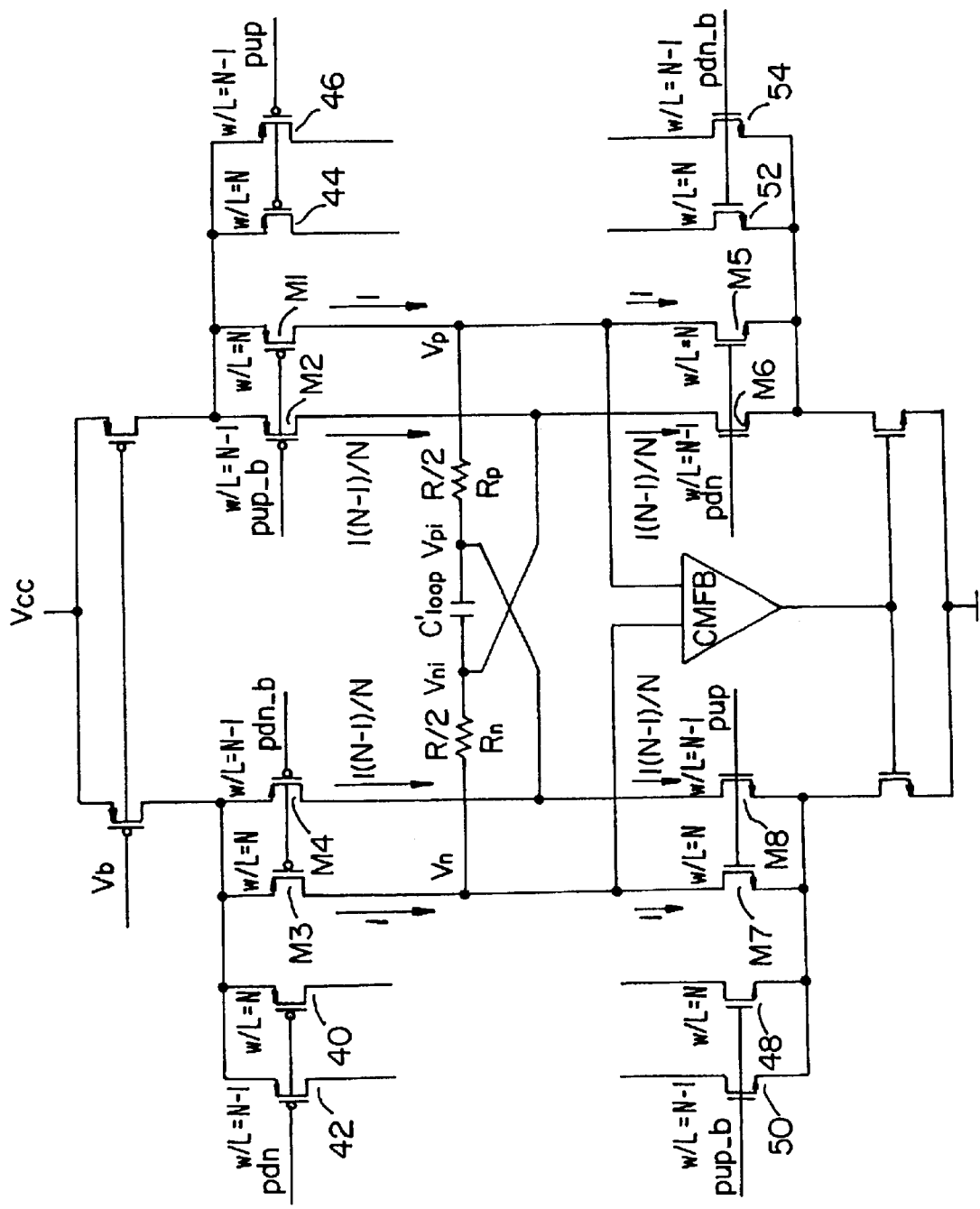
FIG. 5 is a diagram of a differential charge pump with an integrated loop filter according to an embodiment of the present invention.

FIG. 5 shows an embodiment of the present invention as an integrated loop filter in a charge pump circuit with the additional transistor switches of FIGS. 4A–4D. As can be seen, compared to FIG. 1A, transistor switches M1, M3, M5 and M7 have been added, along with different connections to the loop filter. In place of the current steering transistor 17 of FIG. 1A, two differently sized current steering transistors 40 and 42 have been added. The same applies to current steering transistors 44 and 46, 48 and 50, and 52 and 54.

Again, in FIG. 5, consider first the pump up condition where 'pup' (the pump up signal) and 'pdn$_{13}$b' (the complement of pump down signal) are "HIGH", and 'pup$_{13}$b' (the complement of pump up signal) and 'pdn' (the pump down signal) are "LOW". Transistors M1 (with W/L=N), M2 (with W/L=N–1), M7 (with W/L=N) and M8 (with W/L=N–1) are "ON"; M3 (with W/L=N), M4 (with W/L=N–1), M5 (with W/L=N) and M6 (with W/L=N–1) are "OFF". The flow of currents in this situation is exactly identical to what has been discussed previously in FIG. 4A, i.e., current I from transistor M1 flows into V$_p$, then through resistor R$_p$. A fraction of the current $$\frac{N-1}{N}I,$$

branches out to transistor M8. The remaining portion, $$\frac{I}{N}$$

flows through the capacitor, C'loop and recombines with current $$\frac{N-1}{N}I,$$

from transistor M2 to recover back to its original value I and then flows through resistor R$_n$ and is subsequently drained by transistor M7 to ground. This completes the charging cycle of the circuit. Next, for a pump-down condition (i.e., pdn and pup$_{13}$b are "HIGH" and pdn$_{13}$ b and pup are "LOW"), the reverse is true; i.e., current I from transistor M3 flows into V$_n$, then through resistor R$_n$. A fraction of the current $$\frac{N-1}{N}I,$$

branches out to transistor M6. The remaining portion $$\frac{I}{N}$$

flows through the capacitor C'$_{loop}$ and recombines with current $$\frac{N-1}{N}I,$$

from transistor M4 to recover back to its original value I and then flows through resistor R$_p$ and is subsequently drained by transistor M5 to ground. For the condition of pump-up and pump-down both turned on at the same time (i.e., pup and pdn are "HIGH" and pup_b and pdn_b are "LOW"), currents from M1, M2, and M3, M4 flow directly to M5, M6 and M7 and M8 respectively without going through the filter. Finally for no pump-up and no pump-down condition (i.e., pup_b and pdn_b are "HIGH" and pup and pdn are "LOW"), all currents turn off and again no current goes through the filter. Therefore, the charge pump circuit of the preferred embodiment handles all combinations of pump-up and pump-down conditions. Furthermore, for either a pump up or a pump down condition, resistors R$_p$ and R$_n$ see a current of magnitude I and the capacitor C'$_{loop}$ sees a magnitude of $$\frac{I}{N}.$$

From Eq. (2), the capacitor C'$_{loop}$ behaves effectively as if it is N times as big and hence an integrated on-chip capacitor can be utilized.

Finally, it is worthwhile to mention in passing that the above description of the present invention applies when shunt capacitors from V$_p$ and V$_n$ to ground are included. There might be a slight deviation from the designed value.

With the present invention one can avoid problems associated with an operational amplifier based capacitor multiplication circuits and the problems associated with the off-chip capacitor.

Figure 6:
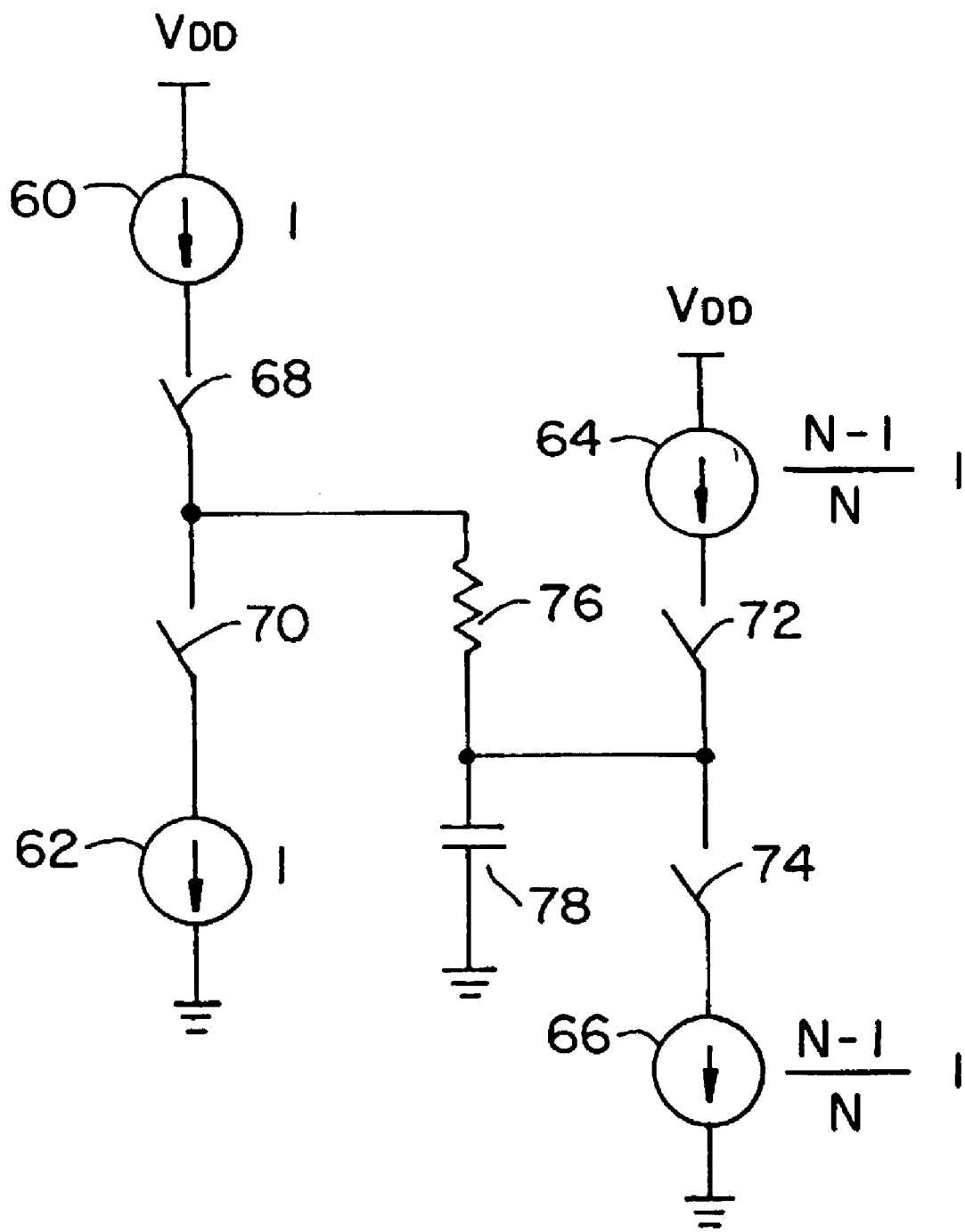
FIG. 6 is a diagram of a single ended charge pump with an integrated loop filter according to an embodiment of the present invention.

FIG. 6 illustrates a single-ended version of the present invention, as contrasted with the differential designs of FIG. 4. This design uses current sources 60 and 62 providing a current I, and current sources 64 and 66 providing a current.

$$\frac{N-1}{N}I.$$

The current sources are switched on by switches 68, 70, 72 and 74. Alternately, the switches could be sized to provide the desired current, similar to as described in FIG. 5, with the unneeded current being shunted away from a current source providing a standard current I.

As can be seen, by appropriate closing and opening of the switches, a full current I can be provided through resistor 76, while shunting off similar current so that only a fractional current flows through capacitor 78.

As will be understood by those with skill in the art, the present invention may be embodied in other specific forms without departing from the essential characteristics thereof. For example, instead of using transistor sizing to provide the different currents, separate current sources could be used. In the embodiment of FIG. 5, the current steering transistors could be combined, such as combining transistors 40 and 42 into a single appropriately sized transistor. Accordingly, the foregoing description is intended to be illustrative, but not limiting, of the scope of the invention, which is set forth in the following claims.

What is claimed is:

1. A charge pump circuit comprising:
   a loop filter including at least a capacitor and a resistor;
   a current generating circuit for generating multiple currents;
   a switching circuit for switching one of said multiple currents through said capacitor, while directing a combination of said multiple currents through said resistor;
   such that a smaller current through said capacitor allows the capacitor to be smaller, wherein
      a first current of said multiple currents is diverted around said capacitor, and routed through said resistor; and
      a second current if said multiple currents is provided through said capacitor and through said resistor;
      such that the combination of said first and second currents are provided through said resistor while only said second current is provided through said capacitor.

2. The circuit of claim 1 wherein said charge pump is differential, and said loop filter comprises a first resistor on a first side of said capacitor and a second resistor on a second side of said capacitor.

3. The circuit of claim 2 further comprising:

a first switching transistor for providing a current of $$I * \frac{N-1}{N}$$

through said first resistor, bypassing said capacitor;

a second switching transistor for providing a current of I through said second resistor;

a third switching transistor for diverting a current of $$I * \left(\frac{N-1}{N}\right)$$

from said current I after it passes through said second resistor, so it does not pass through said capacitor, wherein N is a number greater than zero.

4. The circuit of claim 3 wherein the providing of said currents is accomplished by the sizing of said switching transistors.

5. The circuit of claim 3 further comprising separate current sources for providing at least two of said currents.

6. The circuit of claim 1 wherein said capacitor is integrated onto an integrated circuit chip with said charge pump circuit.

7. A differential charge pump circuit comprising:

a current generating circuit for generating multiple currents;

a loop filter comprising a capacitor, a first resistor on a first side of said capacitor and a second resistor on a second side of said capacitor;

a first switching transistor for providing a current of $$I * \frac{N-1}{N} I$$

through said first resistor, bypassing said capacitor;

a second switching transistor for providing a current of I through said second resistor; and a third switching transistor for diverting a current of I*(N−1) from said current I after it passes through said second resistor, so it does not pass through said capacitor;

such that a smaller current through said capacitor allows the effective capacitance of said capacitor to increase, wherein N is a number greater than zero.

8. A method for allowing an integrated capacitor in a loop filter of a change pump circuit comprising:

generating multiple current;

switching one of said multiple currents through said integrated capacitor, while directing a combination of said multiple currents through a resistor in said loop filter;

such that a smaller current through said capacitor allows the effect in capacitance of said capacitor to increase;

diverting a first current of said multiple currents around said capacitor, and routing said first current through said resistor, and routing a second current of multiple currents through said capacitor and through said resistor; and such that the combination of said first and second currents are routed through said resistor while only said second current is routed through capacitor.

* * * * *